United States Patent [19]

Jarger

[11] 4,293,818
[45] Oct. 6, 1981

[54] FREQUENCY MODULATION THRESHOLD EXTENSION DEMODULATOR UTILIZING FREQUENCY COMPRESSION FEEDBACK WITH FREQUENCY DRIFT CORRECTION

[75] Inventor: Harold F. Jarger, Rochelle Park, N.J.

[73] Assignee: International Telephone and Telegraph Corporation, New York, N.Y.

[21] Appl. No.: 5,060

[22] Filed: Jan. 22, 1979

[51] Int. Cl.³ .............................................. H03D 3/18
[52] U.S. Cl. ...................................... 329/50; 329/122; 455/208; 455/263
[58] Field of Search ......................... 329/50, 122, 134; 325/473–477, 419, 421, 423, 346, 347; 331/10, 11, 12; 455/255, 256, 258, 263, 264, 208

[56] References Cited

U.S. PATENT DOCUMENTS

| | | | |
|---|---|---|---|
| 2,075,503 | 3/1937 | Chaffee | 331/15 |
| 2,272,401 | 2/1942 | Chaffee | 455/256 X |
| 3,231,822 | 1/1966 | Tillotson | 325/346 |
| 3,371,281 | 2/1968 | Powell | 329/122 |
| 3,742,361 | 6/1973 | Wason | 329/50 X |
| 4,087,756 | 5/1978 | Rogers, Jr. | 325/423 X |
| 4,101,837 | 7/1978 | Clayton, Jr. et al. | 329/134 X |

Primary Examiner—Siegfried H. Grimm
Assistant Examiner—Edward P. Westin
Attorney, Agent, or Firm—John T. O'Halloran; Jeffrey P. Morris

[57] ABSTRACT

In a frequency modulation detection system, the voltage controlled local oscillator is controlled by two feedback loops. One feedback loop, containing a phase detector and a resonant circuit, responds sensitively to slight lack of alignment between the phase of the intermediate frequency signal and the phase of the driven oscillations in the resonant circuit, to correct the local oscillator over an automatic frequency control circuit having a low pass characteristic. The other feedback circuit is a frequency compression loop which uses a linear discriminator circuit to demodulate the modulated intermediate frequency. The audio frequency output of this discriminator is used to cause the local oscillator to rapidly track, at intermediate frequency-offset the radio frequency input. By use of two feedback loops it is possible to use a narrow band intermediate frequency filter, thereby reducing noise, without having drift of the circuits internally create noise products.

10 Claims, 2 Drawing Figures

FREQUENCY MODULATION THRESHOLD EXTENSION DEMODULATOR UTILIZING FREQUENCY COMPRESSION FEEDBACK WITH FREQUENCY DRIFT CORRECTION

BACKGROUND OF THE INVENTION

1. Description of the Prior Art

The following item of prior art is a useful tutorial aid in understanding the background of the invention;

Sams & Co.: Reference Data for Radio Engineers Sixth Edition 1975, pp. 23-11 to 23-13.

SUMMARY OF THE INVENTION

In a frequency compression feedback demodulator system, it has, in the past, been necessary to use very stable circuits, so as to ensure that the intermediate frequency signal, passing through the narrow pass-band intermediate frequency filter, is not distorted by being too close to or in the edge of the pass band. If the signal is too close, to the edge of the pass band, additional noise in the form of distortion products is created within the filter. Such additional noise defeats, in part, the attempted extension of the threshold of the demodulator to the region of lesser input signal power.

In the instant invention, the advantages of threshold extension by way of negative frequency modulation feedback is retained, without need for extremely stable circuits, by introducing an automatic frequency correction loop which centers the actual instantaneous intermediate frequency in the pass-band of the intermediate frequency filter. The intermediate frequency filter acts as its own automatic frequency control circuit. Thus, the IF loop filter is used to provide a 90 degree shifted intermediate frequency signal to one input of a phase demodulator, the other input of which receives an amplitude-limited intermediate frequency. The phase demodulator, in turn, supplies the automatic frequency control signal filtered by a low pass filter, to the local oscillator.

DESCRIPTION OF THE PREFERRED EMBODIMENT

Figure 1:
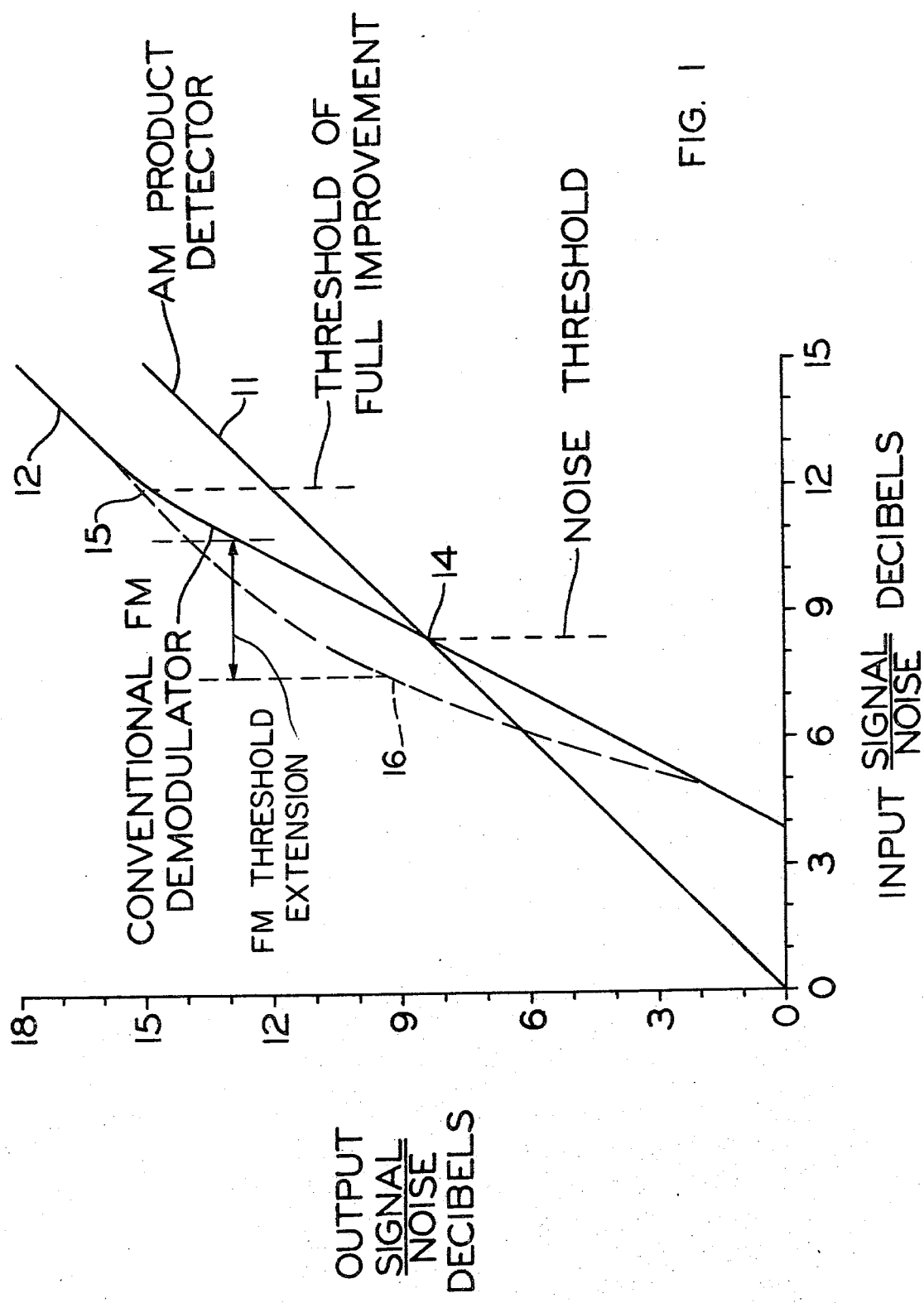
FIG. 1 is a graph which illustrates how the signal to noise ratio at the output of a radio receiver varies with the same ratio at the input.

FIG. 1 sets forth the relationship between the signal to noise ratios at the inputs and outputs of two different receivers. The input is plotted along the abscissa as the independent variable while the output is plotted along the ordinate as the dependent variable. As one goes to the right, or goes up, the input and output, respectively, signal to noise ratios increase.

To give an idea of the scale of the Figure, at zero dB, the power of the signal and noise would be equal, while at 8.4 dB, the peaks of the random noise would exceed the level of constant signal about 1% of the time.

The graphs of the Figure are based on theoretical models, and the graphs will vary somewhat with difference assumptions. However, the shapes are generally correct and consistent with actual results.

The graph of FIG. 1 is characteristic of an amplitude modulation receiver having an ideal linear product demodulator. As can be seen from the graph, the signal to noise ratio at the output equals that at the input. This can be rationalized as being characteristic of a perfect linear system.

The graph 12 is characteristic of an ordinary frequency modulation receiver having a conventional demodulator. When the input signal to noise ratio is about 9 dB, the frequency demodulation system output is just as noisy as is the perfect amplitude demodulation system output, since the graphs 11 and 12 intersect at 14.

If the input signal to noise ratio decreases, more noise peaks capture the demodulator, and the output of the frequency demodulation system becomes even noisier than that of the perfect linear amplitude demodulation system. The term capture describes the action wherein the motion of the sum vector of the signal vector and the noise vector is controlled principally by the stronger one of the latter two, while the weaker one merely slightly perturbs the said motion.

If the input signal to noise ratio improves, fewer of the noise peaks at the input of the frequency demodulation system are effective to capture the demodulator, because the more powerful signal captures the demodulator, until, at the knee 15 of graph 12, the frequency demodulation system has made its full improvement over the amplitude demodulation system. As the input signal to noise ratio increases further, the frequency demodulation system of graph 12 continues to have a constant advantage over the amplitude demodulation system.

The ordinate for point 14 is called the noise threshold of the frequency demodulation system, and has a nominal value of 9 dB. The ordinate for knee 15 of curve 12 is known as the threshold of full improvement and has a nominal value of 12 dB.

Threshold extension is the term applied to a system wherein the portion of graph 12 to the left of knee 15 is made to shift sideways to the left, by an improvement to the frequency demodulation system. Thus, with threshold extension, even through the input signal to noise ratio is less than the noise threshold of about 9 dB, the frequency demodulation system will provide an output which has better signal to noise characteristics than a linear amplitude modulation system. Further improvement of threshold extension is achieved by the present invention by extension of the standard threshold extension further as indicated by the dotted curve 16.

Threshold extension is important for the successful reception of weak signals, such as those from orbiting satellites. As is evident from the prior art cited above, threshold extension has been achieved in the past by a variety of means. The present invention achieves threshold extension with an improved degree of stability.

Figure 2:
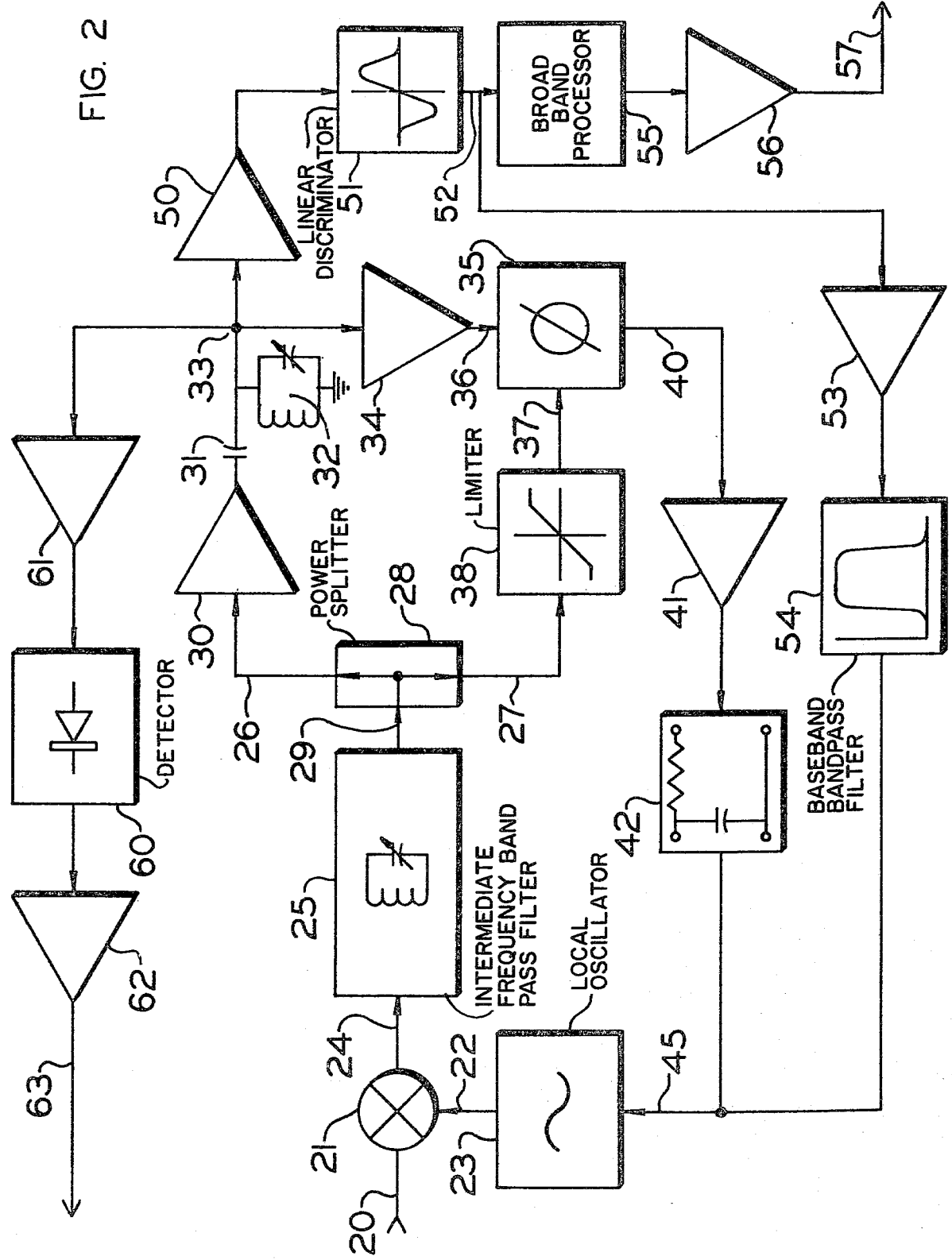
FIG. 2 is a wiring diagram of the frequency modulation demodulator system of the invention.

Referring now to FIG. 2, a radio frequency input signal which is frequency modulated with a wide frequency deviation is applied to one input 20 of mixer 21 in the present invention. The other input 22 of mixer 21 receives local oscillations from local oscillator 23, which approximately tracks the input signal, offset by an amount which, for this example, is 2.5 megahertz. The output at 24 is an intermediate frequency signal of reduced frequency deviation and centered at 2.5 megahertz, as will be evident from the explanation below.

The signal at output 24 is applied to a band pass filter 25, with pass band centered at 2.5 megahertz. It will be understood that this filter, in practice, could be combined with stages of intermediate frequency amplification, if desired. The effect of the band pass filter 25 is to exclude from the detector the noise signals which are outside the narrow pass band, thereby improving the signal to noise ratio at the input of the detector, and thus at its output.

The output of the wide band filter 25 is fed over conductor 29 to power splitter 28, to energize conductors 26 and 27 with similar reduced frequency deviation filtered signals.

Conductor 26 feeds the said signal through buffer amplifier 30 and small capacitance coupling capacitor 31 to tank circuit 32. Thus, the tank circuit 32 is loosely coupled to amplifier 30 and little power will be transferred from amplifier 30 to tank circuit 32 because of the small size of coupling capacitor 31. The tank circuit 32 serves as both the narrow band loop filter and the frequency determining element for automatic frequency control when the loop IF frequency and the resonant frequency of the loop filter coincide, 2.5 MHz in this example. The signal fed to the tank circuit 32 through the small coupling capacitor 31 will be shifted by 90° at junction 33. If the IF frequency or the loop filter resonant frequency should change, the phase shift at junction 33 will also change.

As previously mentioned, when the signal at conductor 26 is at the resonance frequency of tank circuit 32, the voltage at junction 33 is 90° out of phase with the voltage at conductor 26. If the signal at conductor 26 changes frequency, the 90° relationship changes quite rapidly and sensitively because of the high Q factor of tank circuit 32. Thus, the combination of coupling capacitor 31 and tank circuit 32 act as a variable phase shifter, giving a phase shift which depends on the instantaneous frequency of the signal at conductor 26.

For reliability of signal capture, the Q factor of coil 32 is not made higher than required to give a uniform variation of phase shift over the extent of the reduced frequency deviation of the signal on conductor 26.

The phase shifted signal at junction 33 is applied through buffer amplifier 34, to one input 36 of phase detector 35.

The signal on conductor 27 is applied to limiter 38 and the limited signal is supplied to the other input 37 of phase detector 35.

Limiter 38 can be a conventional limiter, such as used in a frequency modulation receiver, which supplies a sine wave output, or it can be a hard limiter which supplies a square wave output.

The phase detector 35 can be any one of several types, all of which produce an output voltage which is a measure of the deviation of the phase relationships between inputs at conductors 36 and 37 from the 90° relationship. The output at conductor 40 of phase detector 35 therefore is a measure of the out-of-tune condition of the receiver.

The voltage on conductor 40 is applied through buffer amplifier 41 and low pass filter 42 to the control input 45 of voltage controlled local oscillator 23 in such a sense as to tend to reduce the voltage on conductor 40 toward zero. Thus, the just described circuit is a feedback loop for automatic frequency control.

The low pass filter 42 acts as an integrating circuit and cuts off at about 20 hertz. That is, signals up to 20 Hz are passed. Thus, if the received radio signal shifts or fluctuates rapidly, as happens during magnetic disturbances or in high speed flight, the disclosed system will keep locked in, as long as the rate of change of frequency is within the bounds dictated by the band width of the entire feedback loop, of which the 20 Hz low pass filter 42 is the major determinator.

Changes of components and operating voltages in the receiver will produce drift, almost always at a slow rate. This will also be corrected by the just described feedback loop.

Since the tank circuit 32 and the tuned circuits of wide band pass filter 25 are, for the most part, closely similar, (i.e., tuned to frequencies close together) it follows that slow drift caused by aging, humidity changes, temperature changes or barometric changes will likely be in the same direction and in somewhat similar amounts. The just disclosed automatic frequency control loop will therefore tend to keep the reduced frequency deviation signal on conductor 24 centered in the drifting pass band of narrow band pass filter 25. This avoids the creation of noise products produced when the average frequency on conductor 24 drifts close to the edge of the pass band of filter 25.

The signal at junction 33 is fed through buffer amplifier 50 to broad band linear discriminator 51, having a center frequency of, for example, 2.5 MHz. The demodulated output appearing on conductor 52 is linearly related to the frequency deviation at junction 33 over the reduced band width of the signal thereat.

The demodulated output on conductor 52 is fed, by way of buffer 53 and band pass filter 54, to the control input 45 of voltage controlled local oscillator 23 in such a sense as to reduce the original wide frequency deviation of the frequency modulation signal to a reduced frequency deviation. The band pass filter 54 has a band pass from about 50 Hz up to the top modulation frequency. Thus, the just described loop acts as a frequency compression feedback loop.

The pass bands of the low pass filter 42 and the band pass filters 54 do not overlap. This assists in assuring stability, as each feedback loop will act independently of the other. It is important, to assure stability.

The demodulated output on conductor 52 is fed through broad band processor 55 and buffer 56 to the output conductor 57 for use. The broad band processor, may, for example, be a circuit for improving the shape of signal pulses in a frequency shift keying system.

The signal appearing at junction 33 is a frequency modulated signal of reduced deviation, but it is not limited. Accordingly, the amplitude variation of the signal at junction 33 can be sensed in detector 60, which is supplied from junction 33 by way of amplifier 61. The detected amplitude variation signals from detector 60 are amplified in amplifier 62 and supplied, by way of conductor 63, to the intermediate frequency stages or the radio frequency stages, or to both sets of stages of the radio receiver. In said stages the variable voltage on conductor 63 is utilized to control the gain of the stages, as is common in automatic gain control systems.

We claim:
1. In a threshold extension receiver:
a source of frequency modulated radio frequency signals having a frequency deviation therebetween;
a mixer;
a local oscillator supplying local oscillations;
an intermediate frequency filter having a pass band substantially narrower than the frequency deviation of the said frequency modulated radio frequency signals;
means for feeding said source of frequency modulated radio frequency signals and the local osacillations to said mixer, to thereby produce intermedi- ate frequency oscillations in said mixer, said intermediate frequency oscillations having an average frequency within the pass band of said intermediate frequency filter;

means for feeding the intermediate frequency oscillations of said mixer to said intermediate frequency filter, whereby the intermediate frequency filter will pass such components of said intermediate frequency oscillations as lie within the pass band;

negative frequency feedback means, responsive to the signals which are passed by the pass band of said intermediate frequency filter, for modulating the frequency of said local oscillator such as to cause the intermediate frequency oscillations produced by said mixer to have a reduced frequency deviation, compared to the frequency deviation of said radio frequency signals;

said negative feedback means having two independent feedback loops acting in parallel;

said first feedback loop comprising means, responsive to the average frequency of said intermediate frequency oscillations, for slowly causing said local oscillator to change frequency in such a sense as to maintain said average frequency at a desired value;

said second feedback loop comprising means, responsive to the instantaneous frequency of said intermediate frequency oscillations, for quickly causing said local oscillator to change frequency in such a sense as to drive the instantaneous frequency of said intermediate frequency oscillations towards said desired value; wherein said first feedback loop comprises a band pass filter; and said second feedback loop comprises a low pass filter; and wherein the pass bands of the low pass filter and the band pass filter have no pass band in common; wherein said first feedback loop comprises:
  a resonant tank circuit tuned to said desired value;
  means to reactively and loosely couple said resonant tank circuit to the signals passed by said intermediate frequency filter;
  whereby said resonant circuit will sympathetically resonate approximately in quadrature to said signals when the instantaneous frequency of said signals is at said desired value; and
  whereby as the instantaneous frequency of said signals departs from said value, the phase relationship between said signals and the resulting sympathetic oscillations varies rapidly and monotonically with the departure;
  a phase detector having a first and second input and whose output is the vector cross product of two inputs;
  means to feed the voltage across said resonant circuit to the first input of said phase detector;
  means to feed the signals passed by said intermediate frequency filter to the second input of said phase detector; and
  means to feed the output of said phase detector to said local oscillator.

2. The receiver of claim 1 in which said second feedback loop comprises:
  broad band frequency detector means, responsive to the oscillations of said resonant tank circuit, for detecting the frequency modulation of said oscillations and for developing an output indicative of said oscillations; and
  means for feeding said output to said local oscillator.

3. The receiver of claim 2 in which said broad band frequency detector is substantially linear over the pass band of the intermediate frequency filter.

4. The receiver of claim 3 comprising
  a band pass filter in the said feedback loop which passes all modulation frequencies developed by said broad band frequency demodulator, except those frequencies adjacent zero frequencies.

5. The receiver of claim 4 in which the band pass filter passes all frequencies from approximately 50 hertz up to the highest modulation frequency, and blocks frequencies between zero and approximately less than 50 hertz.

6. The receiver in claim 1 in which the means to reactively and loosely couple comprises a capacitor.

7. The receiver of claim 1 in which the said resonant tank circuit is a high Q circuit.

8. The receiver of claim 1 in which the said means to feed the signals passed by said intermediate frequency filter to the second input of said phase detector comprises a limiter.

9. The receiver of claim 8 in which the said limiter is a hard limiter, which produces, from the frequency modulated input, a duration modulated pulse wave output.

10. The receiver of claim 1 comprising:
  means, responsive to the amplitude of oscillation of said resonant tank, for detecting the same and developing an automatic gain control signal, monotonically related to the said amplitude of oscillation; and
  means for supplying said automatic gain control signal to at least one front-end stage of said receiver.

* * * * *